(12) United States Patent
Hwang et al.

(10) Patent No.: US 11,928,363 B2
(45) Date of Patent: Mar. 12, 2024

(54) OPERATING METHOD OF HOST DEVICE AND STORAGE DEVICE AND STORAGE DEVICE

(71) Applicant: SAMSUNG ELECTRONICS CO., LTD., Suwon-si (KR)

(72) Inventors: Jun Ha Hwang, Seoul (KR); Chul-Hwan Choo, Hwaseong-si (KR); Gye Sik Oh, Seoul (KR); Young Bin Lee, Seoul (KR); Sung Won Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 156 days.

(21) Appl. No.: 17/713,599

(22) Filed: Apr. 5, 2022

(65) Prior Publication Data
US 2023/0049195 A1 Feb. 16, 2023

(30) Foreign Application Priority Data

Aug. 12, 2021 (KR) .......................... 10-2021-0106589

(51) Int. Cl.
*G06F 3/06* (2006.01)
(52) U.S. Cl.
CPC .......... *G06F 3/0659* (2013.01); *G06F 3/0604* (2013.01); *G06F 3/0679* (2013.01)
(58) Field of Classification Search
CPC .... G06F 3/0659; G06F 3/0604; G06F 3/0679; G06F 3/0658; G11C 2029/0411; G11C 7/1009; G11C 11/40615; G11C 11/40622; G11C 11/40611; G11C 7/1045; G11C 11/4096
See application file for complete search history.

(56) References Cited

U.S. PATENT DOCUMENTS

| | | | |
|---|---|---|---|
| 6,650,587 B2 | 11/2003 | Derner et al. | |
| 7,342,841 B2 | 3/2008 | Jain et al. | |
| 9,281,045 B1* | 3/2016 | Anand | G11C 11/4096 |
| 9,754,655 B2 | 9/2017 | Saifuddin et al. | |
| 9,767,881 B2 | 9/2017 | Kim et al. | |
| 2005/0108460 A1 | 5/2005 | David | |
| 2005/0219930 A1* | 10/2005 | Takahashi | G11C 11/40615 365/222 |
| 2014/0189230 A1* | 7/2014 | Wang | G11C 11/40622 711/106 |
| 2020/0194054 A1* | 6/2020 | Kaminski | G11C 11/4072 |
| 2020/0321051 A1 | 10/2020 | Suh et al. | |
| 2020/0402569 A1 | 12/2020 | He et al. | |
| 2022/0129200 A1* | 4/2022 | Van Der Veen | G11C 11/4078 |

FOREIGN PATENT DOCUMENTS

KR 10-2004-0008025 A 1/2004

* cited by examiner

*Primary Examiner* — Jason W Blust
(74) *Attorney, Agent, or Firm* — Sughrue Mion, PLLC

(57) ABSTRACT

A method of operating a host device to control a storage device which includes a register is provided. The method includes: providing the storage device with a partial array refresh setting indicating a non-masking segment among a masking segment and the non-masking segment; providing a refresh command to the storage device; and providing a write command for the masking segment to the storage device to control the storage device to store data while a partial array refresh is performed in the storage device based on the refresh command.

20 Claims, 14 Drawing Sheets

FIG. 3

MR25 Definition

| Function | Register Type | Operand | Data |
|---|---|---|---|
| CK Pair TERM (Other Shared dies' CK ODT Info) | Write-only | OP[4] | 0 : All ranks sharing CK Pair are un-terminated (default)<br>1 : One of ranks sharing CK Pair are terminated |
| CK Inputs TERM (Other Shared dies' CA ODT Info) | | OP[5] | 0 : All ranks sharing CK Inputs are un-terminated (default)<br>1 : One of ranks sharing CK Inputs are terminated |
| PARC (Partial Array Refresh Control) | | OP[6] | 0 : PAAR disable (default)<br>1 : PAAR enable |

FIG. 4

MR23 Register Information

| OP[7] | OP[6] | OP[5] | OP[4] | OP[3] | OP[2] | OP[1] | OP[0] |
|---|---|---|---|---|---|---|---|
| PASR Segment Mask ||||||||

MR23 Definition

| Function | Register Type | Operand | Data |
|---|---|---|---|
| PASR Segment Mask | Write Only | [7:0] | 0 : Segment Refresh Enable (default)<br>1 : Segment Refresh Disable |

FIG. 7
| BA1 | BA2 | BA3 | BA4 | BA5 | BA6 | BA7 | BA8 |
|---|---|---|---|---|---|---|---|
| S7 | S7 | S7 | S7 | S7 | S7 | S7 | S7 |
| S6 | S6 | S6 | S6 | S6 | S6 | S6 | S6 |
| S5 | S5 | S5 | S5 | S5 | S5 | S5 | S5 |
| S4 | S4 | S4 | S4 | S4 | S4 | S4 | S4 |
| S3 | S3 | S3 | S3 | S3 | S3 | S3 | S3 |
| S2 | S2 | S2 | S2 | S2 | S2 | S2 | S2 |
| S1 | S1 | S1 | S1 | S1 | S1 | S1 | S1 |
| S0 | S0 | S0 | S0 | S0 | S0 | S0 | S0 |
 Masking Segment
 Non-Masking Segment

FIG. 8
| BA1 | BA2 | BA3 | BA4 | BA5 | BA6 | BA7 | BA8 |
|---|---|---|---|---|---|---|---|
| S7 | S7 | S7 | S7 | S7 | S7 | S7 | S7 |
| S6 | S6 | S6 | S6 | S6 | S6 | S6 | S6 |
| S5 | S5 | S5 | S5 | S5 | S5 | S5 | S5 |
| S4 | S4 | S4 | S4 | S4 | S4 | S4 | S4 |
| S3 | S3 | S3 | S3 | S3 | S3 | S3 | S3 |
| S2 | S2 | S2 | S2 | S2 | S2 | S2 | S2 |
| S1 | S1 | S1 | S1 | S1 | S1 | S1 | S1 |
| S0 | S0 | S0 | S0 | S0 | S0 | S0 | S0 |
 Masking Segment
 Non-Masking Segment

FIG. 10
| BA1 | BA2 | BA3 | BA4 | BA5 | BA6 | BA7 | BA8 |
|-----|-----|-----|-----|-----|-----|-----|-----|
| S7 | S7 | S7 | S7 | S7 | S7 | S7 | S7 |
| S6 | S6 | S6 | S6 | S6 | S6 | S6 | S6 |
| S5 | S5 | S5 | S5 | S5 | S5 | S5 | S5 |
| S4 | S4 | S4 | S4 | S4 | S4 | S4 | S4 |
| S3 | S3 | S3 | S3 | S3 | S3 | S3 | S3 |
| S2 | S2 | S2 | S2 | S2 | S2 | S2 | S2 |
| S1 | S1 | S1 | S1 | S1 | S1 | S1 | S1 |
| S0 | S0 | S0 | S0 | S0 | S0 | S0 | S0 |
 Masking Segment
 Non-Masking Segment

OPERATING METHOD OF HOST DEVICE AND STORAGE DEVICE AND STORAGE DEVICE

CROSS-REFERENCE TO RELATED APPLICATION

This application claims priority from Korean Patent Application No. 10-2021-0106589 filed on Aug. 12, 2021 in the Korean Intellectual Property Office, the disclosure of which is incorporated by reference herein in its entirety.

BACKGROUND

1. Field

The present disclosure relates to a method for operating a host device and a storage device, and the storage device.

2. Description of Related Art

A volatile memory device, for example, a Dynamic RAM (DRAM) device, stores data in a cell capacitor. As data is stored in the cell capacitor in the form of electric charges, the electric charges accumulated in the cell capacitor are lost over time. A refresh operation that senses, amplifies, and rewrites the data may be performed to refresh the stored data before the electric charges stored in the cell capacitor are completely lost.

There is a need to improved efficiency in the refresh operation. In this regard, a Partial Array Auto Refresh (PAAR) or a Partial Array Self Refresh (PASR) that masks and refreshes a portion of the memory array may be used.

SUMMARY

One or more example embodiments provide an operating method of a host device having improved operating performance.

One or more example embodiments also provide an operating method of a storage device having improved operating performance.

One or more example embodiments also provide a storage device having improved operating performance.

However, aspects of the present disclosure are not restricted to those specifically set forth herein.

According to example embodiments, there is provided a method of operating a host device to control a storage device which includes a register, the method includes: providing the storage device with a partial array refresh setting indicating a non-masking segment among a masking segment and the non-masking segment; providing a refresh command to the storage device; and providing a write command for the masking segment to the storage device to control the storage device to store data while a partial array refresh is performed in the storage device based on the refresh command.

According to example embodiments, there is provided a method of operating a storage device, the method includes: providing a register storing a partial array refresh setting indicating a non-masking segment among a masking segment and the non-masking segment; receiving a refresh command; receiving a write command for the masking segment; and storing data according to the write command while performing the partial array refresh for the non-masking segment based on the refresh command.

According to example embodiments, there is provided a storage device including: a memory controller; and a first memory device configured to store data under control of the memory controller. The first memory device includes: a first mode register in which a partial array refresh enable setting is set; and a second mode register configured to store data indicating a non-masking segment that is a target of a partial array refresh, and a masking segment that is not the target of the partial array refresh. The memory controller is configured to: receive a refresh command from a host through a host interface; receive a write command for the masking segment from the host through the host interface; and store data in the first memory device according to the write command while performing the partial array refresh for the non-masking segment based on the refresh command in the first memory device.

BRIEF DESCRIPTION OF THE DRAWINGS

The above and other aspects, features and advantages will be more clearly understood from the following detailed description taken in conjunction with the attached drawings, in which:

FIGS. 3 to 5 are diagrams for explaining a mode register according to some example embodiments;

FIGS. 7 to 10 are diagrams for explaining operation of a memory system according to some example embodiments;

DETAILED DESCRIPTION

Hereinafter, example embodiments will be described with reference to the accompanying drawings.

Figure 1:
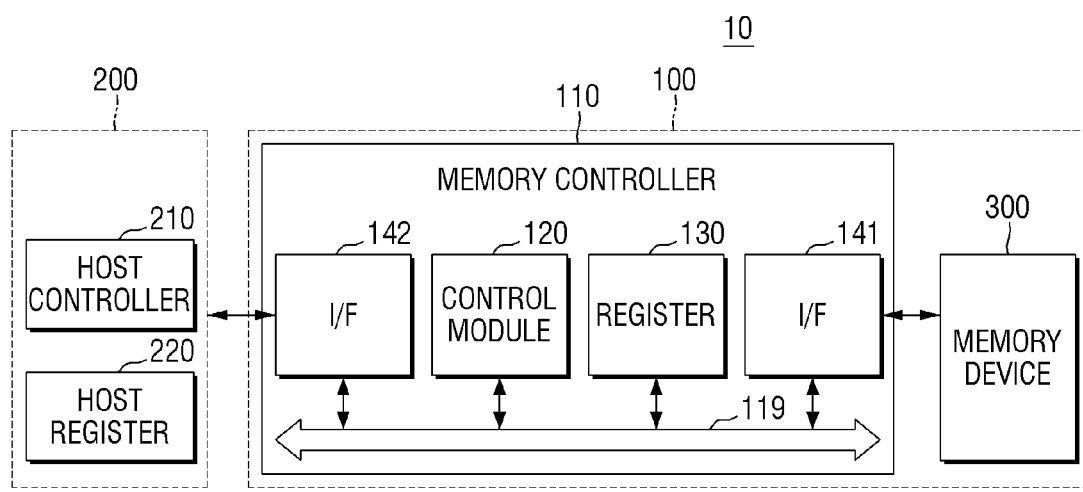
FIG. 1 is a block diagram for explaining a memory system according to some example embodiments.
Figure 2:
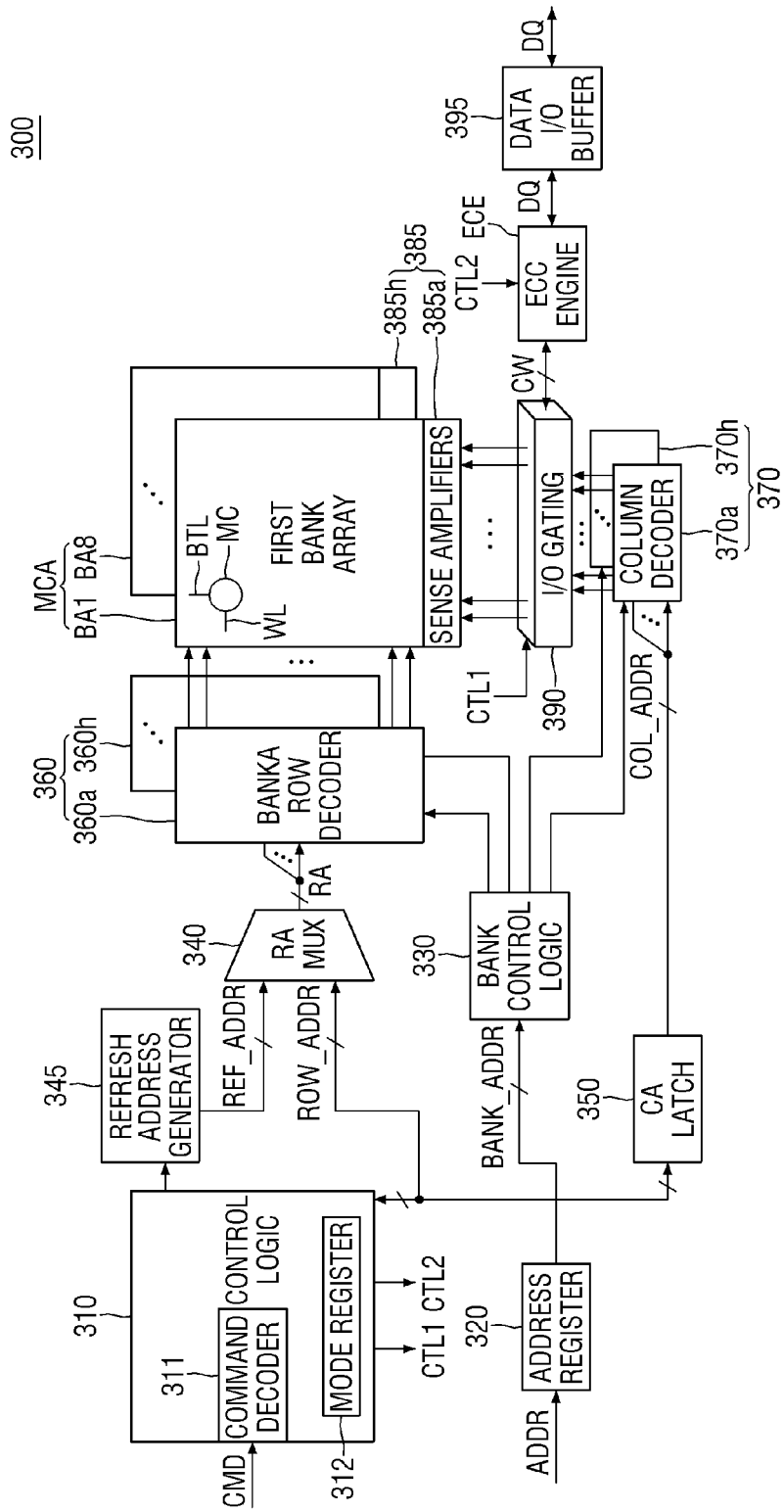
FIG. 2 is a block diagram for explaining a memory device according to some example embodiments.
Figure 5:
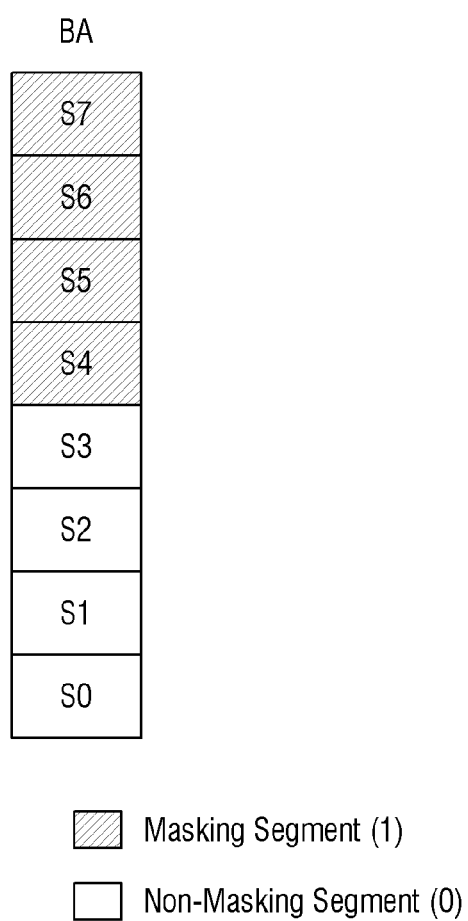

FIG. 1 is a block diagram for explaining a memory system 10 according to some example embodiments. FIG. 2 is a block diagram for explaining a memory device according to some example embodiments. FIGS. 3 to 5 are diagrams for explaining a mode register according to some example embodiments.

For example, the memory system 10 of FIG. 1 may be a mobile device such as a mobile phone, a smart phone, a tablet personal computer (PC), a wearable device, a healthcare device or an Internet of Things (IOT) device. However, the memory system 10 of FIG. 1 is not necessarily limited to these devices, but may also be other devices, such as a personal computer, a laptop computer, a server, a media player or an automotive device such as a navigation device.

Referring to FIG. 1, the storage device 100 may communicate with the host device 200 and write data or read date based on a request from the host device 200.

Further, the storage device 100 may control the refresh operation according to the request of the host device 200. The host device 200 may include a host controller 210, a host register 220, and the like. The host controller 210 may provide the memory controller 110 with commands, data, and the like necessary for operating the storage device 100.

The host register 220 may store data necessary for the operation of the host controller 210.

The storage device 100 includes a memory controller 110, and a memory device 300 that stores data under the control of the memory controller 110.

The memory controller 110 may include a memory interface 141, a host interface 142, a control module 120, and a register 130 connected to each other through the bus 119. The control module 120 communicates with the host device 200 through the host interface 142, and controls the memory device 300 through the memory interface 141.

The host interface 142 provides a connection that may send and receive data to and from the host device 200, and may be consistent with various interface schemes such as, for example, Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded Universal Flash Storage (eUFS), and compact flash (CF) card interface. The memory interface 141 may be implemented to comply with standard conventions such as toggle or Open NAND Flash Interface (ONFI).

The memory device 300 is a volatile memory device, and may be, for example, a Dynamic RAM (DRAM), but example embodiments are not limited thereto.

Referring to FIG. 2, the memory device 300 may include a control logic 310, an address register 320, a bank control logic 330, a row address multiplexer 340, a refresh address generator 345, a column address latch 350, a row decoder 360, a column decoder 370, a sense amplifier 385, an input/output gating circuit 390, a memory cell array MCA, an ECC engine ECE, and a data input/output buffer 395.

The memory cell array MCA may include a plurality of memory cells MC for storing data. For example, the memory cell array MCA may include first to eighth bank arrays BA1 to BA8. Each of the first to eighth bank arrays BA1 to BA8 may include a plurality of word lines WL and a plurality of bit lines BTL, and a plurality of memory cells MC formed in regions in which the word lines WL intersect the bit lines BTL.

The memory cell array MCA may include first to eighth bank arrays BA1 to BA8. Although FIG. 2 shows a memory device 300 including eight bank arrays BA1 to BA8, example embodiments are not limited thereto, and the memory device 300 may include any number of bank arrays.

The control logic 310 may control the operation of the memory device 300. For example, the control logic 310 may generate control signals CL1 and CL2 such that the memory device 300 performs an operation of writing the data or an operation of reading the data. The control logic 310 may include a command decoder 311 that decodes the command CMD received from outside, and a mode register 312 for setting the operating mode of the memory device 300.

For example, the command decoder 311 may decode a write enable signal, a row address strobe signal, a column address strobe signal, a chip selection signal and the like to generate control signals corresponding to the command CMD. The control logic 310 may also receive a clock signal and a clock enable signal for driving the memory device 300 in a synchronous manner.

The mode register 312 may store information about the refresh operation. Hereinafter, although a system in which the memory system complies with the DRAM standard published by Joint Electron Device Engineering Council (JEDEC) will be described, example embodiments are not limited thereto.

The mode register 312 may include a first mode register MR25 shown in FIG. 3 and a second mode register MR23 shown in FIG. 4.

Referring to FIG. 3, the first mode register MR25 may store information as to whether to perform a partial array refresh. In some example embodiments, although the partial array refresh may include Partial Array Auto Refresh (PAAR), Partial Array Self Refresh (PASR), and the like, example embodiments are not limited thereto.

For example, in operating codes of the first mode register MR25, OP[6] may indicate whether the partial array refresh is enabled.

That is, if OP[6] is set to 0, the partial array refresh is in a disabled state. In this case, the memory device 300 refreshes all the segments of all the bank arrays BA1 to BA8 in response to the refresh command provided from the host. That is, the memory device 300 may perform an all bank refresh operation based on the refresh command being received from the host while OP[6] is set to 0.

In contrast, if OP[6] is set to 1, the partial array refresh is in an enabled state. The memory device 300 performs a partial array refresh that performs a refresh only on the unmasked non-masking segment based on the refresh command received from the host while OP[6] is set to 1.

Referring to FIG. 4, the second mode register MR23 may store information defining the masking segment and the non-masking segment.

The second mode register MR23 may store data indicating whether to mask segments in a particular bank array, using eight operating codes of OP[0] to OP[7]. For example, if the values of OP[0] to OP[7] are 00000111, as shown in FIG. 5, 0th to 3rd segments S0 to S3 indicate the non-masking segments, and 4th segment to 7th segment S4 to S7 indicate the masking segments.

The memory device 300 may perform the refresh operation on the basis of information of the first mode register MR25 and the second mode register MR23 in response to the refresh command provided from the host.

Referring to FIG. 2 again, the control logic 310 may control the refresh address generator 345 to generate a refresh row address REF_ADDR on the basis of the information of the mode register 312 in response to the refresh command.

The address register 320 may receive the address ADDR from outside (e.g., host). For example, the address register 320 may receive an address ADDR that includes a bank address BANK_ADDR, a row address ROW_ADDR, and a column address COL_ADDR. The address register 320 may provide the received bank address BANK_ADDR to the bank control logic 330, may the received row address ROW_ADDR to the row address multiplexer 340, and provide the received column address COL_ADDR to the column address latch 350.

The bank control logic 330 may generate bank control signals according to the bank address BANK_ADDR received from the address register 320. In response to these bank control signals, the bank row decoder corresponding to the bank address BANK_ADDR among the first to eighth bank row decoders 360a to 360h may be activated, and the bank column decoder corresponding to the bank address BANK_ADDR among the first to eighth bank column decoders 370a to 370h may be activated.

The row address multiplexer 340 may receive the row address ROW_ADDR from the address register 320, and receive the refresh row address REF_ADDR from the refresh address generator 345. The row address multiplexer 340 may selectively output the row address ROW_ADDR received from the address register 320 or the refresh row address REF_ADDR received from the refresh address generator 345 as the row address RA. The row address RA that is output from the row address multiplexer 340 may be applied to each of the first to eighth bank row decoders 360a to 360h.

The refresh address generator 345 may generate the refresh row address REF_ADDR for refreshing the memory cells. The refresh address generator 345 may provide the refresh row address REF_ADDR to the row address multiplexer 340. Accordingly, the memory cells placed in the word line corresponding to the refresh row address REF_ADDR may be refreshed.

The column address latch 350 may receive the column address COL_ADDR from the address register 320 and temporarily store the received column address COL_ADDR. Further, the column address latch 350 may gradually increase (i.e., increment) the received column address COL_ADDR in a burst mode. The column address latch 350 may apply a temporarily stored or gradually increased column address COL_ADDR to each of the first to eighth bank column decoders 370a to 370h.

The row decoder 360 may include first to eighth bank row decoders 360a to 360h connected to each of the first to eighth bank arrays BA1 to BA8. The column decoder 370 may include first to eighth bank column decoders 370a to 370h connected to each of the first to eighth bank arrays BA1 to BA8. The sense amplifier 385 may include first to eighth bank sense amplifiers 385a to 385h connected to each of the first to eighth bank arrays BA1 to BA8.

A bank row decoder activated by the bank control logic 330 among the first to eighth bank row decoders 360a to 360h may decode the row address RA that is output from the row address multiplexer 340 to activate the word line corresponding to the row address RA. For example, the activated bank row decoder may apply a word line driving voltage to the word line corresponding to the row address RA.

The bank column decoder activated by the bank control logic 330 among the first to eighth bank column decoders 370a to 370h may activate the bank sense amplifiers 385a to 385h corresponding to the bank address BANK_ADDR and the column address COL_ADDR through the input/output gating circuit 390.

The input/output gating circuit 390 may include input data mask logic, read data latches for storing the data output from the first to eighth bank arrays BA1 to BA8, and write drivers for writing data to the first to eighth bank arrays BA1 to BA8, together with circuits for gating the input and output data.

A code word CW to be read from one of the first to eighth bank arrays BA1 to BA8 is detected by the bank sense amplifier 385a to 385h corresponding to one bank array, and may be stored in the read data latches.

The ECC engine ECE may perform ECC decoding on the code word CW stored in the read data latches. When an error is detected in data of the code word CW, the ECC engine ECE may provide the corrected data signal DQ to the external memory controller through the data input/output buffer 395.

The data signal DQ to be written to one bank array among the first to eighth bank arrays BA1 to BA8 is provided to the ECC engine ECE, the ECC engine ECE generates parity bits on the basis of the data signal DQ, and provides the data signal DQ and the parity bits to the input/output gating circuit 390. The input/output gating circuit 390 may write the data signal DQ and the parity bits to a subpage of one bank array through the write drivers.

The data input/output buffer 395 may provide the data signal DQ to the ECC engine ECE in the write operation, and may provide the data signal DQ, which is provided from the ECC engine ECE, to the external host device in the read operation.

Referring to FIG. 1 again, the register 130 of the memory controller 110 may store information about the refresh. For example, the register 130 may store information similar to that of the mode register (312 of FIG. 2) described above. That is, the register 130 may store information about the PAAR or PASR operation.

For example, the same information as the above-mentioned first mode register MR25 is stored in the first region of the register 130, and the same information as the above-mentioned second mode register MR23 may be stored in the second region of the register 130.

Although only one memory device 300 is shown in FIG. 1 for convenience of explanation, depending on example embodiments, the number of memory devices 300 controlled by the memory controller 110 may be much larger than this. In this case, the register 130 may store the refresh information of each memory device 300.

On the other hand, the refresh-related information stored in the register 130 may also be stored in the host register 220. As a result, the host controller 210 may know which memory device 300 the partial array refresh is performed by the refresh command transmitted to the storage device 100.

Such a storage device 100 may be in a state of being physically separated from the host device 200, or may be implemented inside the same package as the host device 200.

Hereinafter, operation of a memory system according to some example embodiments will be described referring to FIGS. 6 to 10.

Figure 6:
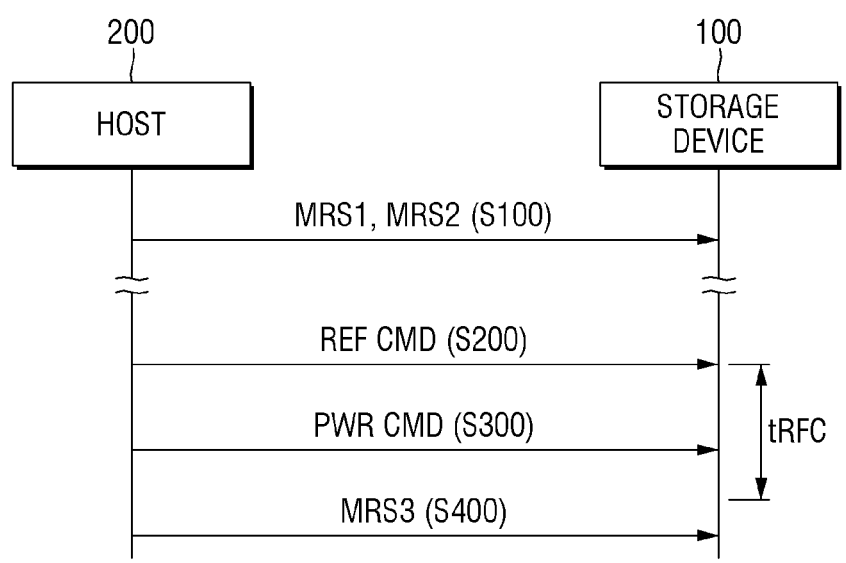
FIG. 6 is a flowchart for explaining operation of a memory system according to some example embodiments.

FIG. 6 is a flowchart for explaining operation of a memory system according to some example embodiments. FIGS. 7 to 10 are diagrams for explaining operation of a memory system according to some example embodiments.

Referring to FIG. 6, the host device 200 provides the storage device 100 with the setting commands MRS1 and MRS2 (S100).

The setting command MRS1 may be a command which enables the partial array refresh and may be provided to the mode register MR25, and the setting command MRS2 may be a command which defines the masking segment and the non-masking segment in the mode register MR23.

That is, in the storage device 100, the partial array refresh may be enabled by the setting command MRS1, and the non-masking segment to be a target of the partial array refresh may be defined by the setting command MRS2.

For example, before receiving the setting command MRS2, as shown in FIG. 7, all the segments S0 to S7 of all banks BA1 to BA8 may be in the non-masking state. Then, some segments may be masked by the setting command MRS2 as shown in FIG. 8. Such masking segments are not subjected to refresh (e.g., PAAR) in response to the refresh command provided from the host device 200. Alternatively, such masking segments are not subjected to the refresh (e.g., PASR) performed inside the storage device 100.

Here, the setting commands MRS1 and MRS2 may be in any form as long as the setting commands MRS1 and MRS2 are signals for setting the mode register related to the refresh operation. For example, the setting commands MRS1 and MRS2 may be a Mode Register Set (MRS) command in DDR4 or a Mode Register Write (MRW) command in DDR5.

The host device 200 may provide the setting commands MRS1 and MRS2 to the storage device 100. In DDR4, the host device 200 may provide the setting commands MRS1 and MRS2 to the storage device 100 when all the banks of the memory device are in an idle state.

Further, the mode register setting process of DDR5 is also similar. When all banks are in the idle state during a normal operation, the host device 200 may provide the setting command MRW to the storage device 100.

Although FIG. 6 shows, for convenience of understanding, an operation (S100) in which the host device 200 provides the setting commands MRS1 and MRS2 to the storage device 100, example embodiments are not limited thereto. The values of the mode registers MR23 and MR25 may be set to an initial setting of the storage device 100.

The storage device 100 may transmit, to the host device 200, response signals corresponding to each operation as needed.

Figure 9:
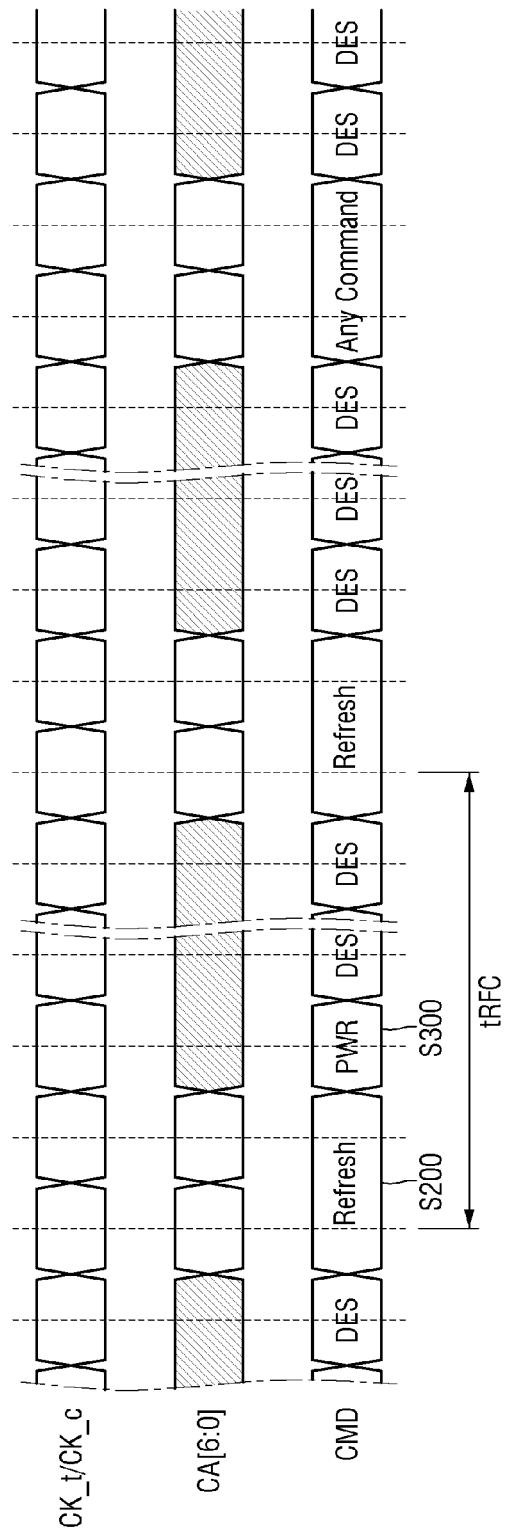

Next, referring to FIGS. 6 and 9, the host device 200 provides the storage device 100 with a refresh command REF (S200).

In some example embodiments, the host device 200 may provide the storage device 100 with the refresh command REF, for example, every 7.8 µs.

The storage device 100 that has received the refresh command REF from the host device 200 may perform the refresh operation by referring to the setting values of the mode registers MR23 and MR25.

In this example, because the partial array refresh is enabled as described above, the non-masking segment shown in FIG. 8 is refreshed.

Referring to FIGS. 6 and 9 again, the host device 200 provides the storage device 100 with the write command PWR, inside a section tRFC in which a partial array refresh is performed in the storage device 100 (S300). For example, the partial array refresh may be performed on the non-masking segments.

The write command PWR provided from the host device 200 may be a write command corresponding to the masking segment shown in FIG. 8. For example, the host device 200 may instruct the storage device 100 to write data to the segment S6 through the write command PWR.

Because the data of the masking segment is data that does not need to be preserved, a refresh is not performed. That is, no operation is performed on the masking segment while the partial array refresh is performed. Thus, a write operation to write new data may be performed on the masking segment during the same section tRFC in which the partial array refresh is performed, and the operating efficiency and performance of the storage device 100 can be thereby improved.

In some example embodiments, although the section tRFC at which the partial array refresh is performed may be, for example, 350 ns, example embodiments are not limited thereto.

Next, referring to FIG. 6, the host device 200 provides the storage device 100 with the setting command MRS3 (S400).

The setting command MRS3 may be a command that defines the masking segment and the non-masking segment in the mode register MR23. For example, the setting command MRS3 may be a command similar to the setting command MRS2.

The setting command MRS3 may be a command for setting the segments, in which the write is performed in the mode register MR23 to correspond to the write command PWR, to the non-masking segment. For example, when the host device 200 instructs the storage device 100 to write data to the segment S6 through the write command PWR, the setting command MRS3 may be a command for setting the segment S6 to the non-masking segment as shown in FIG. 10. Therefore, the segment S6 may then be refreshed in response to the refresh command REF provided from the host device 200.

Figure 11:
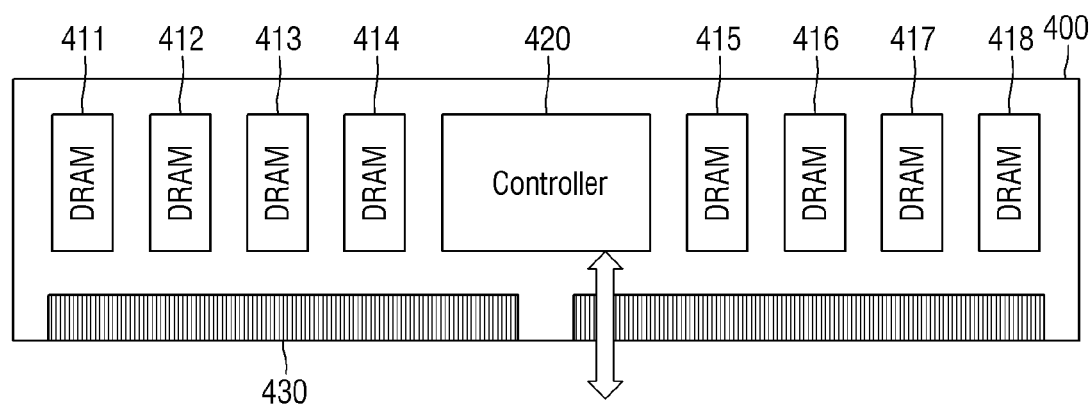
FIG. 11 is a diagram for explaining a storage device according to some example embodiments.
Figure 12:
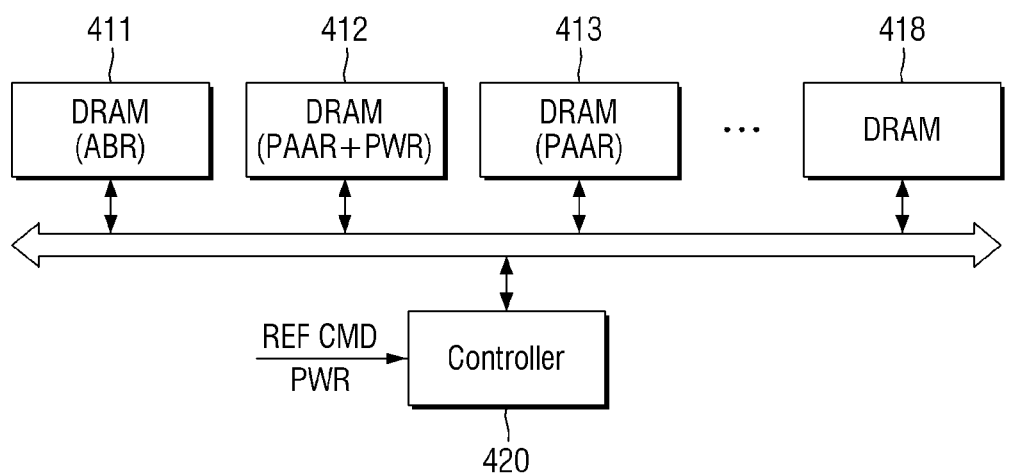
FIG. 12 is a diagram for explaining operation of a storage device according to some example embodiments.

FIG. 11 is a diagram for explaining a storage device according to some example embodiments. FIG. 12 is a diagram for explaining operation of a storage device according to some example embodiments.

Referring to FIG. 11, a storage device 400 may be configured to attach to an electronic device in the form of a module. In some example embodiments, at least one or more storage devices 400 may be equipped on the electronic device.

The storage device 400 may include a plurality of volatile memories 411 to 418, a memory controller 420, and a memory input/output pin 430. The storage device 400 may write data or output the written data according to the control of the host (e.g., an external CPU).

When the storage device 400 includes a DRAM, the CPU may control the storage device 400 according to communication protocols such as Double Data Rate (DDR) and Low Power DDR (LPDDR). For example, in order to read the data stored in the storage device 400, the CPU may transmit commands (e.g., read commands) and addresses to the storage device 400.

The plurality of volatile memories 411 to 418 may be, for example, at least one of DRAM, and SDRAM. Each of the plurality of volatile memories 411 to 418 may communicate the data DQ in response to the signal provided from the memory controller 420. In some example embodiments, the storage device 400 may further include data buffers for data communication, and the data buffers may be synchronized with a data strobe signal DQS to send and receive the data DQ to and from the memory controller 420.

The memory controller 420 may communicate with a plurality of volatile memories 411 to 418 according to a standard of the memory module, such as Dual in-line Memory Module (DIMM), Registered DIMM (RDIMM), Load Reduced DIMM (LRDIMM), and unbuffered DIMM (UDIMM).

The memory controller 420 receives the command/address CA and the clock signal CK of the storage device 400 through the memory input/output pin 430, and may provide the received signals to the plurality of volatile memory devices 411 to 418.

Referring to FIG. 12, the plurality of volatile memory devices 411 to 418 may perform different operations in response to a refresh command REF CMD and a write command PWR according to the mode registers included in each of them.

For example, because the partial array refresh is disabled in the mode register MR25 of the volatile memory device 411, the volatile memory device 411 may perform an all bank refresh operation instead of the partial array refresh in response to the refresh command REF CMD.

Because the partial array refresh is enabled in the mode register MR25 of the volatile memory device 412, and the masking segment also exists in the mode register MR23 of the volatile memory device 412, the volatile memory device 412 may perform the partial array refresh on the non-masking segment and the write operation on the masking segment, in response to the refresh command REF CMD and the write command PAAR_WR.

Although the partial array refresh is enabled in the mode register MR25 of the volatile memory device 413, and a masking segment also exists in the mode register MR23 of the volatile memory device 413, the volatile memory device 413 may perform the partial array refresh operation on the non-masking segment but may not perform the write operation on the masking segment, in response to the refresh command REF CMD and the write command PAAR_WR.

Figure 13:
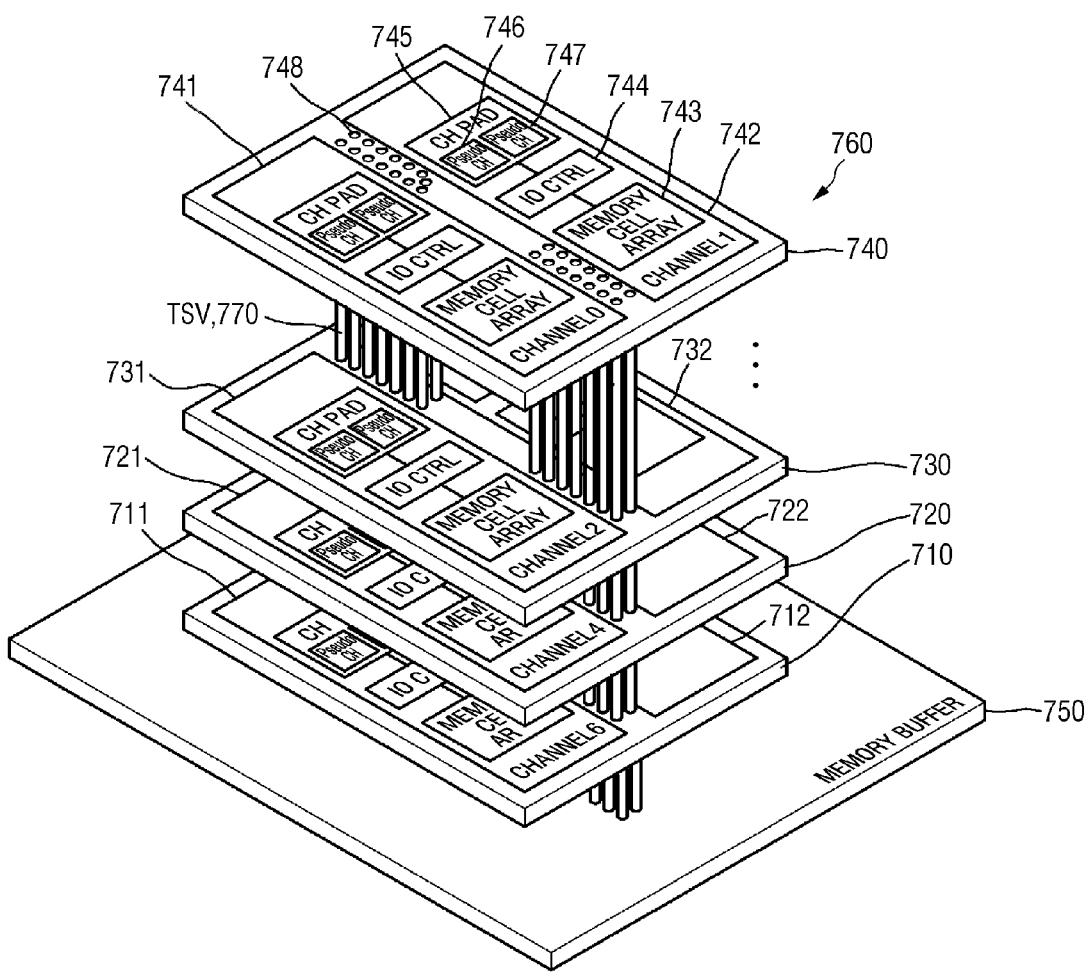
FIG. 13 is a diagram for explaining a memory device according to some example embodiments.

FIG. 13 is a diagram for explaining a storage device according to some example embodiments.

Referring to FIG. 13, a memory device 760 may include a plurality of stacked memory layers 710, 720, 730 and 740. The memory device 760 may be, for example, a High Bandwidth Memory (HBM). The memory layers 710, 720, 730 and 740 may form a plurality of independent interfaces called channels.

Each of the memory layers 710, 720, 730 and 740 may include two channels 711-712, 721-722, 731-732, and 741-742. Although FIG. 13 shows an example in which four memory layers 710, 720, 730 and 740 are stacked in the memory device 760 and are made up of eight channels, example embodiments are not limited thereto. For example, two to eight memory layers may be stacked on the memory device 760.

Each of the channels 711, 712, 721, 722, 731, 732, 741 and 742 may include a memory cell array 743 that operates independently for each channel, an input/output control unit 744 for controlling the memory cell array 743 independently for each channel, and a channel pad unit 745 that provides a channel for the memory cell array 743.

The memory cell array 743 includes memory cells connected to a plurality of word lines and bit lines, and the memory cells may be grouped into a plurality of memory banks and/or memory blocks. A row decoder, a column decoder, a sense amplifier, and the like for accessing the memory cells may be placed inside the region of the memory cell array 743.

The input/output control unit 744 may include RAS control logic, CAS control logic, and the like. The channel pad unit 745 may include pads arranged in the form of a matrix including a plurality of rows and a plurality of columns. Each of the pads of the channel pad unit 745 may be connected to the electrode 748 and the through silicon via (TSV) 770 through the wiring for signal routing.

The memory device 760 may further include a memory buffer 750 placed at the lower end portions of the stacked memory layers 710, 720, 730 and 740. The memory buffer 750 includes an input buffer (or a receiver) that receives commands, addresses, clocks, and data from the control logic, and may buffer the received commands, addresses, clocks and data, and provide them to the channels 711, 712, 721, 722, 731, 732, 741 and 742.

The memory buffer 750 may provide a signal distribution function and a data input/output function to the channels 711, 712, 721, 722, 731, 732, 741 and 742 through the electrodes 748 and the through silicon vias 770.

The memory buffer 750 may communicate with the control logic through conductive means, for example, bumps or solder balls, formed on the outer surface of the memory device 760.

Each of the memory layers 710, 720, 730 and 740 includes two channels. The memory layer 710 includes channel 711 and channel 712, the memory layer 720 includes channel 721 and channel 722, the memory layer 730 includes channel 731 and channel 732, the memory layer 740 includes channel 741 and channel 742. Each of the channels 711, 712, 721, 722, 731, 732, 741 and 742 may be made up of two pseudo channels.

Assuming that the number of data input/output (DQ) pads included in the region of the channel pad unit 745 of each of the channels 711, 712, 721, 722, 731, 732, 741 and 742 is, for example, one-hundred and twenty-eight, one-hundred and twenty-eight DQ pads of the channel pad units 745 of each of the channels 711, 712, 721, 722, 731, 732, 741 and 742 are divided into two groups of pseudo channels 746 and 747, and the number of DQ pads of each of the pseudo channels 746 and 747 may be sixty-four. Here, each of the channels 711, 712, 721, 722, 731, 732, 741 and 742 may be provided with data through eight DQ pads.

Figure 14:
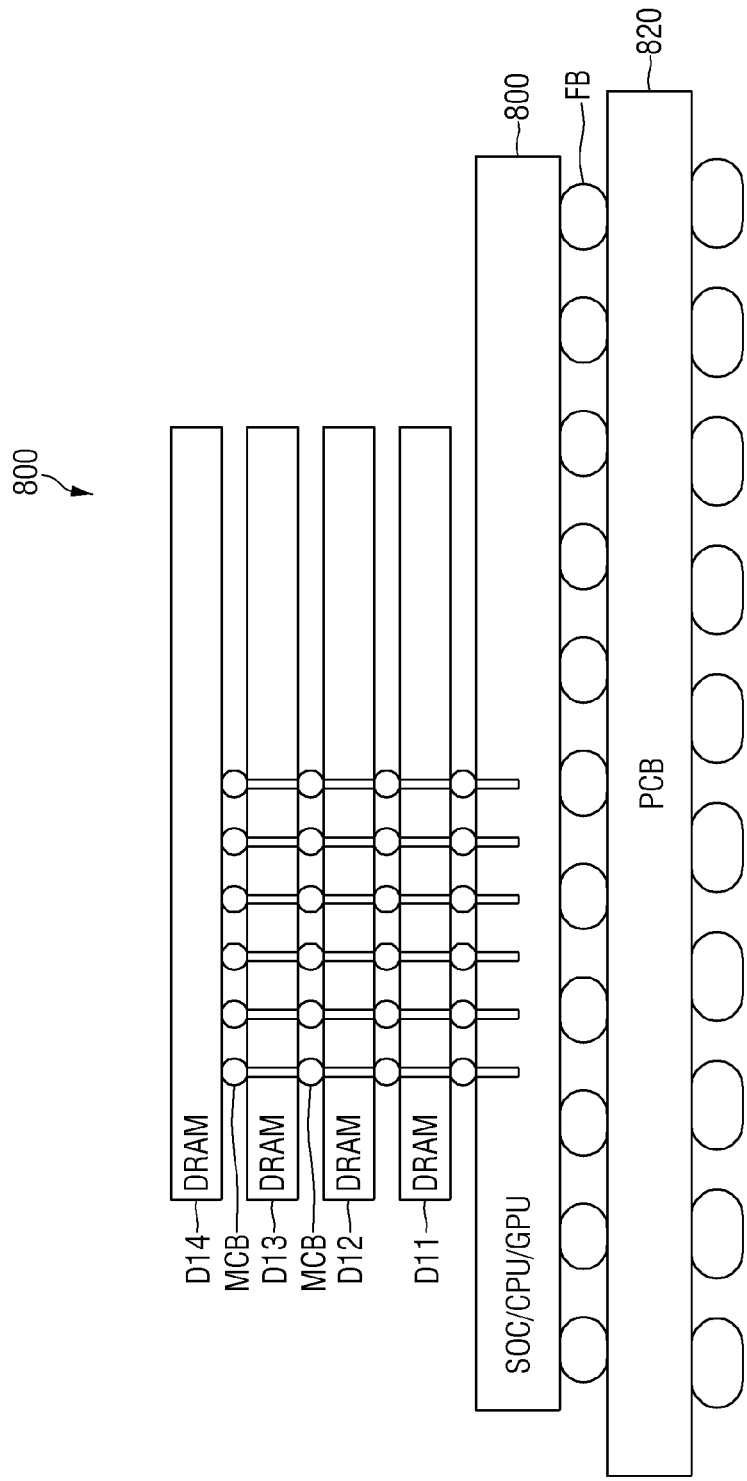
FIGS. 14 and 15 are diagrams showing memory devices according to some example embodiments.
Figure 15:
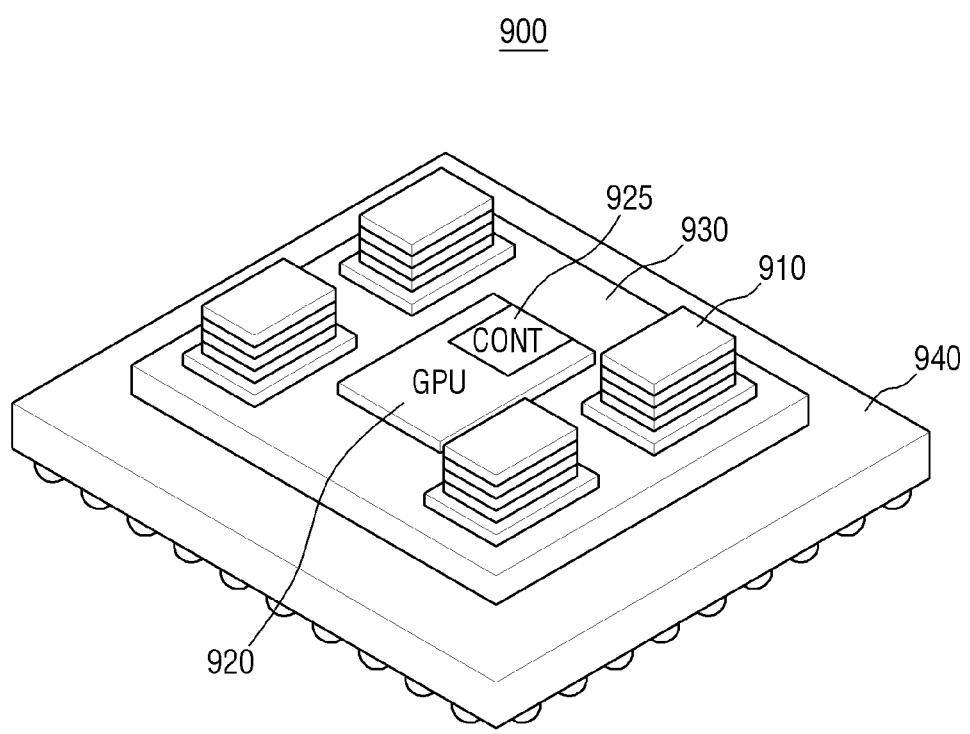

FIGS. 14 and 15 are diagrams showing memory devices according to some example embodiments.

FIG. 14 shows a 3D chip structure 800 in which the host and the HBM are directly connected without an interposer layer.

Referring to FIG. 14, a host die 810, which may be a SoC, a CPU or a GPU, is placed above and connected to the PCB 820 through the flip chip bumps FB.

Memory dies D11 to D14 for forming an HBM structure as described referring to FIG. 13 are stacked on the upper part of the host die 810.

The buffer die or logic die corresponding to the memory buffer 750 of FIG. 13 may be placed between the memory die D11 and the host die 810.

In order to realize the HBM structure, TSV lines called through silicon vias may be formed on the memory dies D11 to D14. The TSV lines may be electrically connected to the micro bumps MCB formed between the memory dies.

FIG. 15 is a structural diagram showing an example of a semiconductor package including a stacked memory device according to example embodiments.

Referring to FIG. 15, the semiconductor package 900 may include one or more stacked memory devices 910 and a graphics processor (GPU) 920, and the graphics processor 920 may include a memory controller 925.

The stacked memory device 910 and the graphic processor 920 are mounted on the interposer 930, and the interposer 930 on which the stacked memory device 910 and the graphic processor 920 may be mounted on the package substrate 940.

The stacked memory device 910 can be implemented in various forms, and in some example embodiments, the stacked memory device 910 may be an HBM type memory device in which a plurality of layers are stacked. Therefore, the stacked memory device 910 includes a buffer die and a plurality of memory dies, and the plurality of memory dies may include a memory cell array and an error correction circuit, respectively.

A plurality of stacked memory devices 910 may be mounted on the interposer 930, and the graphic processor 920 may communicate with the plurality of stacked memory devices 910. In some example embodiments, each of the stacked memory devices 910 and the graphics processor 920 may include a PHY region, and communication may be performed between the stacked memory devices 910 and the graphics processor 920 through the PHY region.

At least one of the components, elements, modules or units represented by a block as illustrated in FIGS. 1, 2, 6, 11-13 and 15 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:

1. A method of operating a host device to control a storage device which includes a register, the method comprising:
    providing the storage device with a partial array refresh setting indicating a non-masking segment among a masking segment and the non-masking segment;
    providing a refresh command to the storage device; and
    providing a write command for the masking segment to the storage device to control the storage device to store data while a partial array refresh is performed in the storage device based on the refresh command.

2. The method of operating the host device of claim 1, further comprising providing a setting command for setting the masking segment to the storage device.

3. The method of operating the host device of claim 1, wherein the providing the storage device with the partial array refresh setting comprises:
    providing the storage device with a first setting command indicating the partial array refresh is enabled to control the storage device to store the first setting command in a first mode register; and
    providing the storage device with a second setting command which indicates the masking segment and the non-masking segment to control the storage device to store the second setting command in a second mode register.

4. The method of operating the host device of claim 3, wherein the first mode register comprises MR25, and
    wherein the second mode register comprises MR23.

5. The method of operating the host device of claim 1, wherein the partial array refresh comprises one of Partial Array Auto Refresh (PAAR) and Partial Array Self Refresh (PASR).

6. A method of operating a storage device, the method comprising:
    providing a register storing a partial array refresh setting indicating a non-masking segment among a masking segment and the non-masking segment;
    receiving a refresh command;
    receiving a write command for the masking segment; and
    storing data according to the write command while performing the partial array refresh for the non-masking segment based on the refresh command.

7. The method of operating the storage device of claim 6, wherein the providing the register comprises:
    receiving a first setting command indicating the partial array refresh is enabled;
    storing the first setting command in a first mode register;
    receiving a second setting command indicating the masking segment and the non-masking segment; and
    storing the second setting command in a second mode register.

8. The method of operating the storage device of claim 7, wherein the first mode register comprises MR25, and
    wherein the second mode register comprises MR23.

9. The method of operating the storage device of claim 8, further comprising receiving a third setting command indicating a new masking segment and a new non-masking segment,
    wherein the masking segment is provided in the new non-masking segment.

10. The method of operating the storage device of claim 6, wherein the partial array refresh comprises any one of Partial Array Auto Refresh (PAAR) and Partial Array Self Refresh (PASR).

11. A storage device comprising:
    a memory controller; and
    a first memory device configured to store data under control of the memory controller,
    wherein the first memory device comprises:
        a first mode register in which a partial array refresh enable setting is set; and
        a second mode register configured to store data indicating a non-masking segment that is a target of a partial array refresh, and a masking segment that is not the target of the partial array refresh,
    wherein the memory controller is configured to:
        receive a refresh command from a host through a host interface;
        receive a write command for the masking segment from the host through the host interface; and
        store data in the first memory device according to the write command while performing the partial array refresh for the non-masking segment based on the refresh command in the first memory device.

12. The storage device of claim 11, further comprising a second memory device configured to store data under control of the memory controller,
    wherein the second memory device is configured to perform an all-bank refresh based on the refresh command and the write command.

13. The storage device of claim 12, further comprising a third memory device configured to store data under control of the memory controller, wherein the third memory device is configured to perform the partial array refresh based on the refresh command and the write command without performing a write operation.

14. The storage device of claim 11, wherein the memory controller is further configured to receive the write command within 350 nanoseconds after receiving the refresh command.

15. The storage device of claim 11, further comprising a register configured to operate control of the memory controller and store refresh information indicating data stored in the first mode register and the second mode register of the first memory device.

16. The storage device of claim 11, wherein the first mode register comprises MR25, and
wherein the second mode register comprises MR23.

17. The storage device of claim 16, wherein the second mode register is configured to store eight operating codes indicating the non-masking segment and the masking segment.

18. The storage device of claim 16, wherein the partial array refresh enable setting is indicated by one of eight operating codes provided in the first mode register.

19. The storage device of claim 11, wherein the memory controller is further configured to receive a setting command indicating a new masking segment and a new non-masking segment, after receiving the write command.

20. The storage device of claim 11, wherein the partial array refresh comprises either Partial Array Auto Refresh (PAAR) or Partial Array Self Refresh (PASR).

* * * * *